(12) United States Patent
Kamiyama

(10) Patent No.: US 10,490,490 B2
(45) Date of Patent: Nov. 26, 2019

(54) THERMALLY CONDUCTIVE SEMICONDUCTOR DEVICE AND MANUFACTURING METHOD THEREOF

(71) Applicant: SHINDENGEN ELECTRIC MANUFACTURING CO., LTD., Tokyo (JP)

(72) Inventor: Yoshihiro Kamiyama, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/520,553

(22) PCT Filed: Mar. 11, 2016

(86) PCT No.: PCT/JP2016/057762
§ 371 (c)(1),
(2) Date: Apr. 20, 2017

(87) PCT Pub. No.: WO2017/154198
PCT Pub. Date: Sep. 14, 2017

(65) Prior Publication Data
US 2018/0108600 A1    Apr. 19, 2018

(51) Int. Cl.
*H01L 23/495*   (2006.01)
*H01L 21/48*    (2006.01)
(Continued)

(52) U.S. Cl.
CPC .... *H01L 23/49568* (2013.01); *H01L 21/4825* (2013.01); *H01L 21/4842* (2013.01); *H01L 21/56* (2013.01); *H01L 21/565* (2013.01); *H01L 23/3107* (2013.01); *H01L 23/3114* (2013.01); *H01L 23/4952* (2013.01); *H01L 23/49513* (2013.01); *H01L 23/49531* (2013.01); *H01L 23/49562* (2013.01); *H01L 23/49575* (2013.01);
(Continued)

(58) Field of Classification Search
CPC .................................................. H01L 23/49531
USPC ......................................................... 257/675
See application file for complete search history.

(56) References Cited

U.S. PATENT DOCUMENTS 9,129,949 B2    9/2015   Asada et al.
2005/0082690 A1    4/2005   Hayashi et al.
(Continued)

FOREIGN PATENT DOCUMENTS

JP    2000-003923    1/2000
JP    2011-238906    11/2011
(Continued)

OTHER PUBLICATIONS

International Search Report for PCT/JP2016/057762 dated May 31, 2016, 4 pages.
(Continued)

*Primary Examiner* — Hsin Yi Hsieh
(74) *Attorney, Agent, or Firm* — Nixon & Vanderhye P.C.

(57) ABSTRACT

A semiconductor device of the present invention includes: a plurality of wiring boards disposed separately from one another; a plurality of semiconductor elements disposed on first main surfaces of the wiring boards and electrically connected to the wiring boards; a plurality of terminals electrically connected to the wiring boards; a sealing resin sealing the wiring boards and the semiconductor elements so that second main surfaces of the wiring boards are exposed.

14 Claims, 14 Drawing Sheets

(51) Int. Cl.
*H01L 21/56* (2006.01)
*H01L 23/31* (2006.01)
*H01L 23/00* (2006.01)

(52) U.S. Cl.
CPC .. *H01L 23/49589* (2013.01); *H01L 23/49541* (2013.01); *H01L 23/49555* (2013.01); *H01L 24/06* (2013.01); *H01L 24/40* (2013.01); *H01L 24/48* (2013.01); *H01L 24/49* (2013.01); *H01L 24/73* (2013.01); *H01L 24/92* (2013.01); *H01L 2224/0603* (2013.01); *H01L 2224/32245* (2013.01); *H01L 2224/40245* (2013.01); *H01L 2224/40247* (2013.01); *H01L 2224/48091* (2013.01); *H01L 2224/48247* (2013.01); *H01L 2224/48472* (2013.01); *H01L 2224/4903* (2013.01); *H01L 2224/49111* (2013.01); *H01L 2224/73221* (2013.01); *H01L 2224/73265* (2013.01); *H01L 2224/92247* (2013.01); *H01L 2924/00014* (2013.01); *H01L 2924/13055* (2013.01); *H01L 2924/181* (2013.01); *H01L 2924/1815* (2013.01)

(56) References Cited

U.S. PATENT DOCUMENTS

| | | |
|---|---|---|
| 2011/0291236 A1 | 12/2011 | Hayashi et al. |
| 2012/0306299 A1 | 12/2012 | Masuzawa et al. |
| 2012/0326289 A1 | 12/2012 | Minamio |
| 2013/0047426 A1 | 2/2013 | Kakimoto et al. |
| 2013/0221516 A1 | 8/2013 | Asada et al. |
| 2015/0318247 A1 | 11/2015 | Kunimitsu et al. |

FOREIGN PATENT DOCUMENTS

| | | |
|---|---|---|
| JP | 2012-182250 | 9/2012 |
| JP | 2012-249457 | 12/2012 |
| JP | 2013-051376 | 3/2013 |
| JP | 2015-026791 | 2/2015 |
| WO | WO 2012/108011 | 8/2012 |
| WO | WO 2014/0174573 | 10/2014 |

OTHER PUBLICATIONS

Written Opinion for PCT/JP2016/057762 dated May 31, 2016, 5 pages.
Notice of Allowance dated Sep. 13, 2017 in Netherlands Application No. 2018490, with partial English translation (9 pages).

US 10,490,490 B2

THERMALLY CONDUCTIVE SEMICONDUCTOR DEVICE AND MANUFACTURING METHOD THEREOF

This application is the U.S. national phase of International Application No. PCT/JP2016/057762 filed Mar. 11, 2016, which designated the U.S., the entire contents of which are hereby incorporated by reference.

TECHNICAL FIELD

The present invention relates to a semiconductor device and a manufacturing method thereof.

BACKGROUND ART

Conventionally, as a power module used for driving control or the like of a three-phase motor, there is a power module such that a semiconductor element serving as a heat source is mounted on an upper surface of a ceramic substrate, and the ceramic substrate and the semiconductor element are sealed with a resin so that a lower surface of the ceramic substrate is exposed (see, for example, Patent Document 1).

CITATION LIST

[Patent Document]
[Patent Document 1] Japanese Unexamined Patent Application Publication No. 2015-26791

DISCLOSURE OF THE INVENTION

Problems to be Solved by the Invention

However, in a semiconductor device using a ceramic substrate, there is a problem that heat generated in the semiconductor element cannot be efficiently released to the outside.

The present invention has been made to solve the above problems, and an object thereof is to provide a semiconductor device, a manufacturing method thereof, and a lead frame capable of efficiently releasing heat generated in a semiconductor element to the outside.

Means for Solving the Problems

In order to solve the above problem, a semiconductor device according to a first aspect of the present invention includes: a plurality of wiring boards disposed separately from one another; a plurality of semiconductor elements disposed on first main surfaces of the wiring boards and electrically connected to the wiring boards; a plurality of terminals electrically connected to the wiring boards; and a resin sealing the wiring boards and the semiconductor elements so that second main surfaces of the wiring boards are exposed.

A method of manufacturing a semiconductor device according to a second aspect of the present invention is a method including: a frame preparation step of preparing a lead frame; a mounting step of fixing a plurality of semiconductor elements onto a first main surface of the lead frame; a connecting step of electrically connecting the semiconductor elements and portions of the wiring boards where the semiconductor elements are not provided; a sealing step of sealing the lead frame and the semiconductor elements with a resin so that a second main surface of the lead frame is exposed; and a cutting step of cutting off the connecting portions of the lead frame.

A lead frame for the semiconductor device according to a third aspect of the present invention is a lead frame in which a plurality of wiring boards and a plurality of terminals are integrally formed, and the plurality of terminals are connected by a plurality of connecting portions.

Effects of the Invention

According to the semiconductor device of the present invention, heat generated in the semiconductor elements can be efficiently transferred from the first main surfaces to the second main surfaces through the wiring boards with high thermal conductivity, so that the heat of the semiconductor elements can be efficiently released to the outside.

MODE FOR CARRYING OUT THE INVENTION

[Semiconductor Device]

Hereinafter, a semiconductor device according to an embodiment of the present invention will be described with reference to the drawings.

Figure 1:
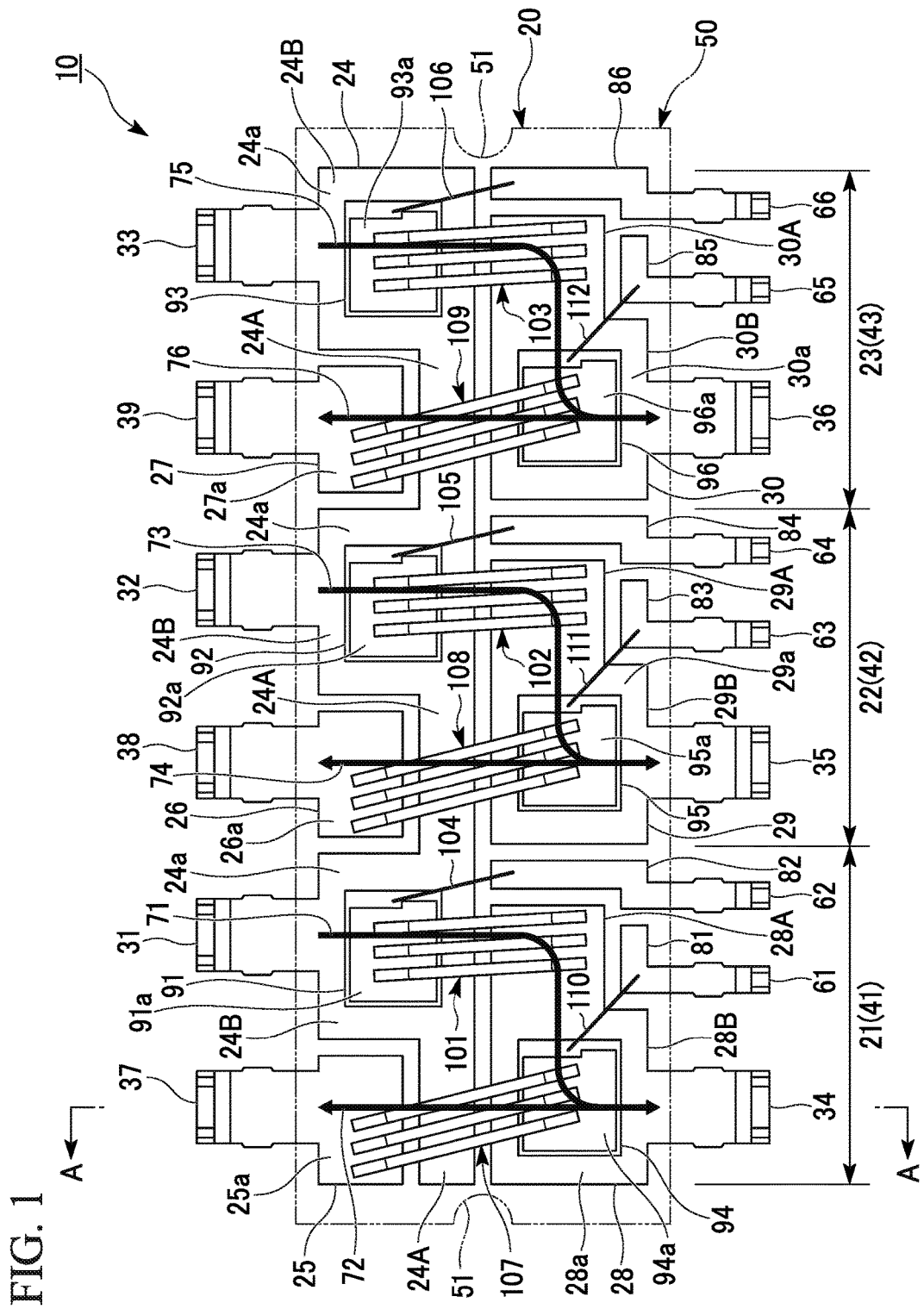
FIG. 1 is a structural plan view showing an example of a semiconductor device according to the present embodiment.

As shown in FIG. 1, a semiconductor device 10 of the present embodiment includes circuit units 41, 42, 43 which include a device main body 20, power supply terminals (leads) 31, 32, 33 protruding from the device main body 20, output terminals (leads) 34, 35, 36, and ground terminals (leads) 37, 38, 39.

The device main body 20 is formed by integrating device units 21, 27, 23 corresponding respectively to the circuit units 41, 42, 43. The circuit units 41, 42, 43 are arranged in this order along a long-side direction (left-right direction in FIG. 1) of the semiconductor device 10

The device units 21, 22, 23 include: a plurality of wiring boards (a power supply wiring board 24, ground wiring boards 25, 26, 27, output wiring boards 28, 29, 30, and gate wiring boards 81 to 86 disposed separately from one another; and semiconductor elements (semiconductor elements 91 to 96) disposed on first main surfaces of some of the wiring boards and electrically connected to the wiring boards.

The device main body 20 further includes a sealing resin 50 sealing the device units 21, 22, 23.

The first circuit unit 41 includes: a first device unit 21; a first power supply terminal 31, a first output terminal 34, and a first ground terminal 37 which protrude from the first device unit 21.

The second circuit unit 42 includes: a second device unit 22; a second power supply terminal 32, a second output terminal 35, and a second ground terminal 38 which protrude from the second device unit 22.

The third circuit unit 43 includes: a third device unit 23; a third power supply terminal 33, a third output terminal 36, and a third ground terminal 39 which protrude from the third device unit 23.

The first circuit unit 41, the second circuit unit 42, and the third circuit unit 43 have substantially the same shape when viewed in plan view.

The first device unit 21 includes the power supply wiring hoard 24, a first ground wiring board 25, a first output wiring board 28, a first semiconductor element 91, and a fourth semiconductor element 94.

The second device unit 22 includes the power supply wiring board 24, a second ground wiring board 26, a second output wiring board 29, a second semiconductor element 92, and a fifth semiconductor element 95.

The third device unit 23 includes the power supply wiring board 24, a third ground wiring board 27, a third output wiring board 30, a third semiconductor element 93, and a sixth semiconductor element 96.

Figure 2:
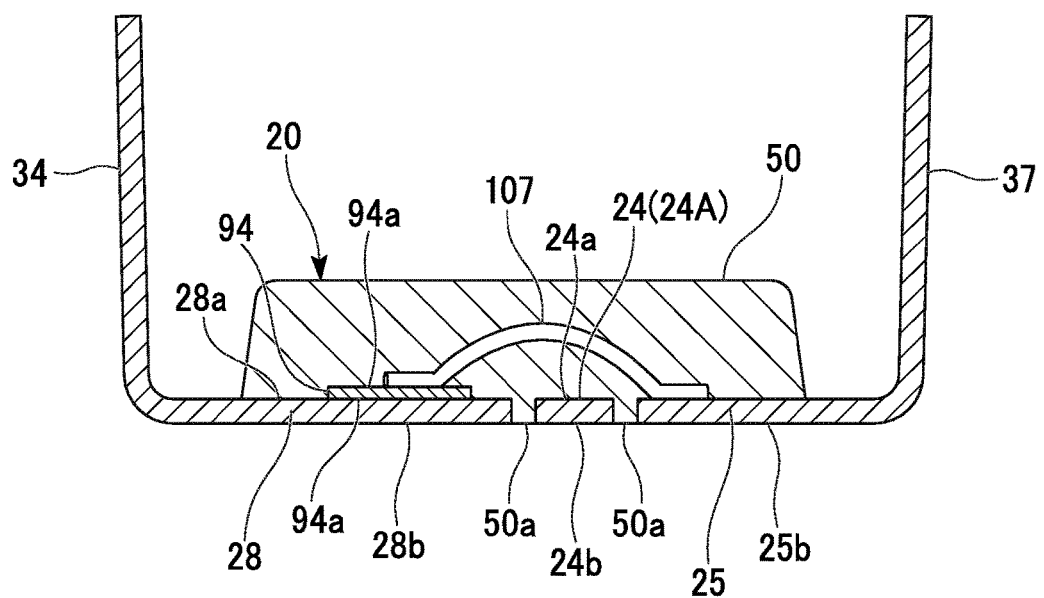
FIG. 2 shows an example of a semiconductor device according to the present embodiment, which is a sectional structural view taken along a line A-A in FIG. 2.

The sealing resin 50 seals the power supply wiring board 24, the ground wiring boards 25, 26, 27, the output wiring boards 28, 29 30, the semiconductor elements 91 to 96, the power supply terminals 31, 32, 33, the output terminals 34, 35, 36, and the ground terminals 37, 38, 39, such that second main surfaces of the power supply wiring board 24, the ground wiring boards 25, 26, 27, and the output wiring boards 28, 29, 30 are exposed. For example, as shown in FIG. 2, the sealing resin 50 seals the power supply wiring board 24, the first ground wiring board 25, the first output wiring board 28, the semiconductor element 94, the output terminal 34, and the ground terminal 37, such that a second main surface 24b of the power supply wiring board 24, a second main surface 25b of the first ground wiring hoard 25, and a second main surface 28b of the first output wiring board 28 are exposed. It is preferable that the second main surface 24b of the power supply wiring board 24, the second main surface 25b of the first ground wiring board 25, and the second main surface 28b of the first output wiring board 28, and a surface (lower surface) 50a, exposed on the second main surface side, of the sealing resin 50 are disposed on the same surface.

The power supply terminals 31, 32, 33, the output terminals 34, 35, 36, and the ground terminals 37, 38, 39 protrude from the sealing resin 50.

The output terminals 34, 35, 36 and the around terminals 37, 38, 39 protrude from the device main body 20 in respectively opposite directions. In other words, both the output terminals 34, 35, 36 and the ground terminals 37, 38, 39 protrude perpendicularly from a side surface, in a long-side direction, of the device main body 20 (a side surface of the sealing resin 50) in respectively opposite directions.

The power supply terminals 31, 32, 33 protrude in the same direction as the ground terminals 37, 38, 39. The power supply terminals 31, 32, 33 are arranged shifted in a direction orthogonal to a linear direction (an arrangement direction of the output terminals 34, 35, 36 and the ground terminals 37, 38, 39).

The above-described linear direction (the arrangement direction of the output terminals 34, 35, 36 and the ground terminals 37, 38, 39) indicates a direction from the first output terminal 34 toward the first ground terminal 37, a direction from the second output terminal 35 toward the second ground terminal 38, and a direction from the third output terminal 36 toward the third ground terminal 39. In other words, the arrangement such that the power supply terminals 31, 32, 33 are shifted in the direction orthogonal to the linear direction means that the power supply terminals 31, 32, 33 are not on a straight line connecting the output terminals 34, 35, 36 and the around terminals 37, 38, 39.

The circuit units 41, 42, 43 may include gate terminals 61 to 66 protruding from the device main body 20 (device units 21, 22, 23). In this case, the power supply terminals 31, 32, 33 and the gate terminals 61 to 66 protrude from the device main body 20 in respectively opposite directions. In other words, the power supply terminals 31, 32, 33 and the gate terminals 61 to 66 protrude perpendicularly from the side surfaces, along the long-side direction, of the device main body 20 in respectively opposite directions.

The gate terminals 61 to 66 protrude from the sealing resin 50.

It is preferable that the power supply terminals 31, 32, 33, the output terminals 34, 35, 36, and the ground terminals 37, 38, 39 are larger in width than the gate terminals 61 to 66.

The plurality of terminals (the power supply terminals 31, 32, 33, the output terminals 34, 35, 36, and the ground terminals 37, 38, 39) are folded in their middle portions in the long-side direction thereof. Tip end portions, in the long-side direction, of the respective terminals extend substantially perpendicular to base end portions thereof. Additionally, the tip end portions, in the long-side direction, of the respective terminals extending from the plurality of wiring boards extend in a direction opposite to the facing directions of the second main surfaces of the plurality of wiring boards (e.g., the second main surface 24b of the power supply wiring board 24, the second main surface 25b of the first wiring board 25, and the second main surface 28b of the first output wiring board 28). In other words, the tip end portions of the respective terminals extending from the plurality of wiring boards extend in a thickness direction of the wiring boards so as to protrude from the first main surfaces of the wiring boards (e.g., the first main surface 24a of the power supply wiring board 24).

The device main body 20 includes: the power supply wiring board 24 in common to the three device units 21, 22, 23; ground wiring boards 25, 26, 27 provided respectively in the device units 21, 22, 23; and output wiring boards 28, 29, 30 provided respectively in the device units 21, 22, 23.

The power supply wiring board 24, the ground wiring boards 25, 26, 27, and the output wiring boards 28, 29, 30 are disposed separately from one another.

The power supply wiring board 24 extends in the long-side direction of the device main body 20. In plan view, the power supply wiring board 24 has a periodic concave-convex shape along the long-side direction thereof. In other words, the power supply wiring board 24 has three pairs of narrow portions 24A and wide portions 24B continuously extending in the direction orthogonal to the above-described linear direction. The narrow portion 24A is small in width in the above-described linear direction. The wide portion 24B is larger in width than the narrow portion 24A in the above-described linear direction. The wide portion 24B protrudes on one side of the narrow portion 24A (toward the upper side in FIG. 1) in the above-described linear direction.

The power supply wiring board 24 extends over the entire three circuit units 41, 42, 43.

The three power supply terminals 31, 32, 33 are connected to the respective wide portions 24B of the power supply wiring board 24, and protrude from the respective wide portions 24B. In other words, the three power supply terminals 31, 32, 33 and the power supply wiring board 24 are integrally formed.

The ground wiring boards 25, 26, 27 are arranged so as to be adjacent to the respective narrow portions 24A of the power supply wiring board 24 on a side of the surface of the power supply wiring board 24 toward which the wide portions 24B protrude.

The ground terminal boards 37, 38, 39 are connected respectively to the ground wiring boards 25, 26, 27, and protrude respectively from the ground wiring boards 25, 26, 27. In other words, the ground terminals 37, 38, 39 and the ground wiring boards 25, 26, 27 are integrally formed.

The output wiring boards 28, 29, 30 are arranged on a side of the surface opposite to the surface of the power supply wiring hoard 24 toward which the wide portions 24B of the power supply wiring board 24 protrude.

In plan view, each of the output wiring boards 28, 29, 30 has a narrow portion 28A (29A, 30A) and a wide portion 28B (29B, 30B) continuously extending in a direction orthogonal to the above-described linear direction. The narrow portions 28A, 29A, 30A are small in width. The wide portions 28B, 29B, 30B are larger in width than the narrow portions 28A, 29A, 30A in the above-described linear direction. The wide portions 28B, 29B, 30B protrude on one side of the narrow portions 28A, 29A, 30A (toward the lower side of FIG. 1) in the above-described linear direction.

The output terminals 34, 35, 36 are connected respectively to the wide portions 28B, 29B, 30B of the output wiring boards 28, 29, 30, and protrude respectively from the wide portions 28B, 29B, 30B. In other words, the output terminals 34, 35, 36 and the output wirings 28, 29, 30 are integrally formed.

The ground wiring boards 25, 26, 27 are arranged so as to respectively face the wide portions 28B, 29B, 30B of the output wiring boards 28, 29, 30 via the narrow portions 24A of the power supply wiring board 24.

The wide portions 24B of the power supply wiring board 24 are arranged so as to face the respective narrow portions 28A, 29A, 30A of the output wiring boards 28, 29, 30.

In a case where the circuit units 41, 42, 43 include the gate terminals 61 to 66, the device main body 20 has the gate wiring boards 81 to 86 provided respectively in the device units 21, 22, 23.

The gate terminals 61 to 66 are connected respectively to the gate wiring boards 81 to 86, and protrude respectively from the gate wiring boards 81 to 86.

In the first circuit unit 41, the first gate wiring board 81 is disposed so as to be adjacent to the narrow portion 28A of the first output wiring board 28. Additionally, the second gate wiring board 82 is disposed between the first output wiring board 28 and the second output wiring board 29.

In the second circuit unit 42, the third gate wiring board 83 is disposed so as to be adjacent to the narrow portion 29A of the second output wiring board 29. Additionally, the fourth gate wiring board 84 is disposed between the second output wiring board 29 and the third output wiring board 30.

In the third circuit unit 43, the fifth gate wiring board 85 is disposed so as to be adjacent to the narrow portion 30A of the third output wiring board 30. Additionally, the sixth gate wiring board 86 is disposed so as to be adjacent to the third output wiring board 30 along the arrangement direction of the third output terminal 36 and the third ground terminal 39.

Semiconductor elements 91, 92, 93 are mounted respectively on the first main surfaces 24a of the portions (the wide portions 24B) of the power supply wiring board 24, which are adjacent to the base end portions of the power supply terminals 31, 32, 33. These semiconductor elements 91, 92, 93 are electrically connected respectively to the output wiring boards 28, 29, 30 via connectors 101, 102, 103.

The semiconductor elements 91, 92, 93 are electrically connected respectively to the gate wiring hoards 82, 84, 86 via connectors 104, 105, 106.

Semiconductor elements 94, 95, 96 are mounted respectively on the first main surfaces 28a, 29a, 30a of the portions (the wide portions 28B, 29B, 30B) of the output wiring boards 28, 29, 30, which are adjacent to the base end portions 34A, 35A, 36A of the output terminal boards 34, 35, 36. These semiconductor elements 94, 95, 96 are electrically connected respectively to the ground wiring boards 25, 26, 27 via connectors 107, 108, 109.

The semiconductor elements 94, 95, 96 are electrically connected respectively to the second gate wiring boards 81, 83, 85 via connectors 110, 111, 112.

As shown in FIG. 1, bonding wires are used as the connectors 101, 102, 103, 107, 108, 109. Additionally, bonding wires are used as the connectors 104, 105, 106, 110, 111, 112.

In the first circuit unit 41, the first power supply terminal 31, the power supply wiring board 24, the first semiconductor element 91, the first connector 101, the first output wiring board 28, and the first output terminal 34 form a first current path 71.

In the second circuit unit 42, the second power supply terminal 32, the power supply wiring board 24, the second semiconductor element 92, the second connector 102, the second output wiring board 29, and the second output terminal 35 form a first current path 73.

In the third circuit unit 43, the third power supply terminal 33, the power supply wiring board 24, the third semiconductor element 93, the third connector 103, the third output wiring board 30, and the third output terminal 36 form a first current path 75.

In the first circuit unit 41, the first output terminal board 34, the first output wiring board 28, the fourth semiconductor element 94, the fourth connector 107, the first ground wiring board 25, and the first ground terminal 37 form a second current path 72.

In the second circuit unit 42, the second output terminal 35, the second output wiring board 29, the fifth semiconductor element 95, the fifth connector 108, the second ground wiring board 26, and the second ground terminal 38 forms a second current path 74.

In the third circuit unit 43, the third output terminal 36, the third output wiring board 30, the sixth semiconductor element 96, the sixth connector 109, the third ground wiring board 27, and the third ground terminal 39 form a second current path 76.

The semiconductor elements 91, 92, 93 disposed respectively on the three wide portions 24B of the power supply wiring board 24 are disposed separately in a direction orthogonal to the above-described linear direction.

Meanwhile, the semiconductor elements 94, 95, 96 disposed respectively on the wide portions 28B, 29B, 30B of the three output wiring boards 28, 29, 30 are disposed separately in a direction orthogonal to the above-described linear direction.

The center of the fifth semiconductor element 95 included in a second element group is disposed between the centers of the first semiconductor element 91 and the second semiconductor element 92 which are included in a first element group, in the direction orthogonal to the above-described linear direction.

Additionally, the center of the sixth semiconductor element 96 included in the second element group is disposed between the centers of the second semiconductor element 92 and the third semiconductor element 93 which are included in the first element group, in the direction orthogonal to the above-described linear direction.

The sealing resin 50 seals the power supply wiring board 24, the output wiring boards 28, 29, 30, and the ground wiring boards 25, 26, 27 so that the second main surfaces of the power supply wiring board 24, the output wiring boards 28, 29, 30, and the ground wiring boards 25, 26, 27 (the surface opposite to the first main surface, i.e., the lower surface of the device main body 20) are exposed. Additionally, as shown in FIG. 1, through holes 51, 51 penetrating in the thickness direction of the power supply wiring board 24, the output wiring boards 28, 29, 30, and the ground wiring boards 25, 26, 27 may be formed in the sealing resin 50.

As shown in FIG. 1, it is preferable that the through holes 51, 51 of the sealing resin 50 are formed at both ends of the sealing resin 50 in a direction orthogonal to the above-described linear direction.

Materials of the power supply wiring board 24, the ground wiring boards 25, 26, 27, the output wiring boards 28, 29, 30, the gate wiring boards 81 to 86, the power supply terminals 31, 32, 33, the output terminals 34, 35, 36, the ground terminals 37, 38, 39, and the gate terminals 61 to 66 are not particularly limited, but may be, for example, materials to be used for general lead frames, such as copper.

The sealing resin 50 is not particularly limited, but may be, for example, a material to be generally used for sealing a semiconductor device.

Figure 3:
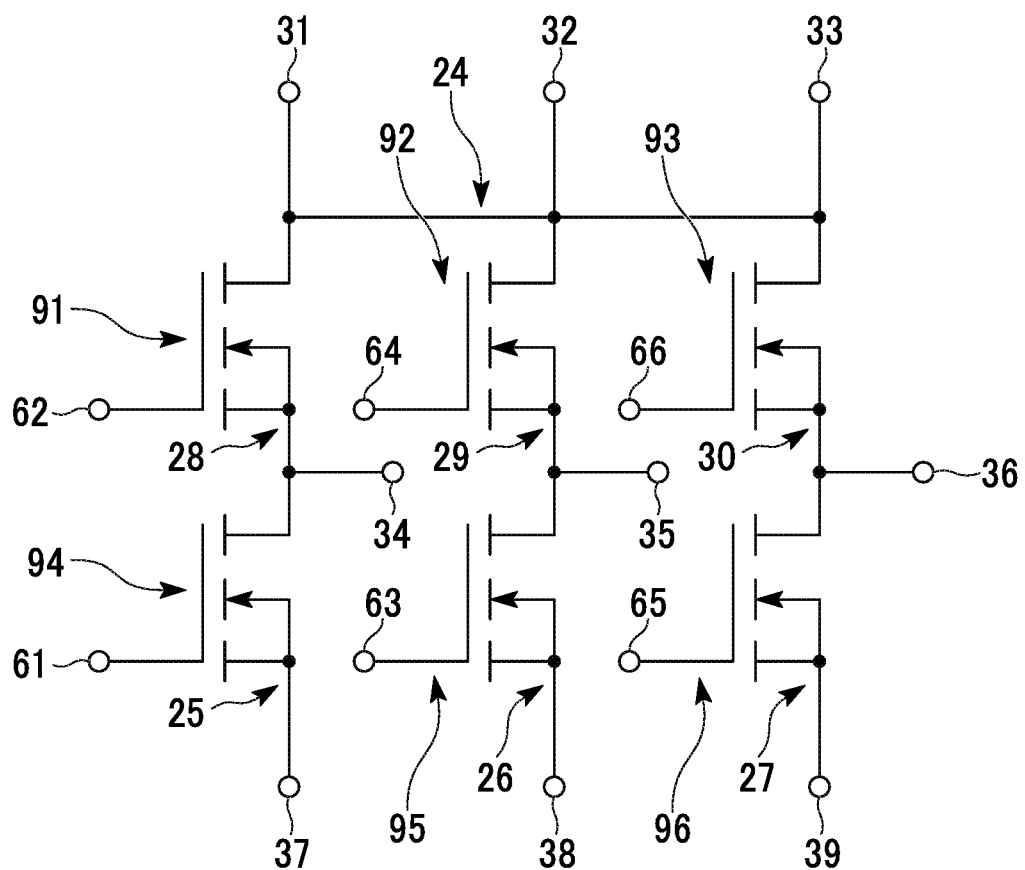
FIG. 3 is an example of a circuit diagram of the semiconductor device according to the present embodiment.

An example of a circuit diagram of the semiconductor device 10 of the present embodiment is as shown in FIG. 3. In the embodiment shown in FIGS. 1 and 3, the first semiconductor element 91, the second semiconductor element 92, the third semiconductor element 93, the fourth semiconductor element 94, the fifth semiconductor element 95, and the sixth semiconductor element 96 are switching elements each including a drain electrode, a source electrode, and a gate electrode. In this case, the semiconductor device 10 of the present embodiment can be used for controlling operation of a motor (e.g., a three-phase motor).

The semiconductor elements 91 to 96 are not particularly limited, but may be, for example, switching elements, or the like.

In a case where the semiconductor elements 91 to 96 are switching elements, the semiconductor device 10 of the present embodiment can be used for controlling operation of a motor (e.g., a three-phase motor).

In the semiconductor device 10 of the present embodiment, the power supply terminals 31, 32, 33 are connected to a DC power supply (not shown).

When a direct current flows through the power supply terminals 31, 32, 33, and a gate signal is intermittently applied to the gate electrodes of the semiconductor elements 91, 92, 93 which are switching elements, a direct current intermittently flows in the first current paths 71, 73, 75 from the power supply terminals 31, 32, 33 toward the output terminal boards 34, 35, 36. On the other hand, when a gate signal is intermittently applied to the gate electrodes of the semiconductor elements 94, 95, 96 which are switching elements, an alternate current flows in the second current paths 72, 74, 76 between the output terminals 34, 35, 36 and the ground terminals 37, 38, 39.

Here, although the semiconductor device 10 including the three circuit units 41, 42, 43 has been illustrated in present embodiment, the present embodiment is not limited thereto. It is sufficient that the semiconductor device of the present embodiment includes at least one circuit unit.

Figure 4:
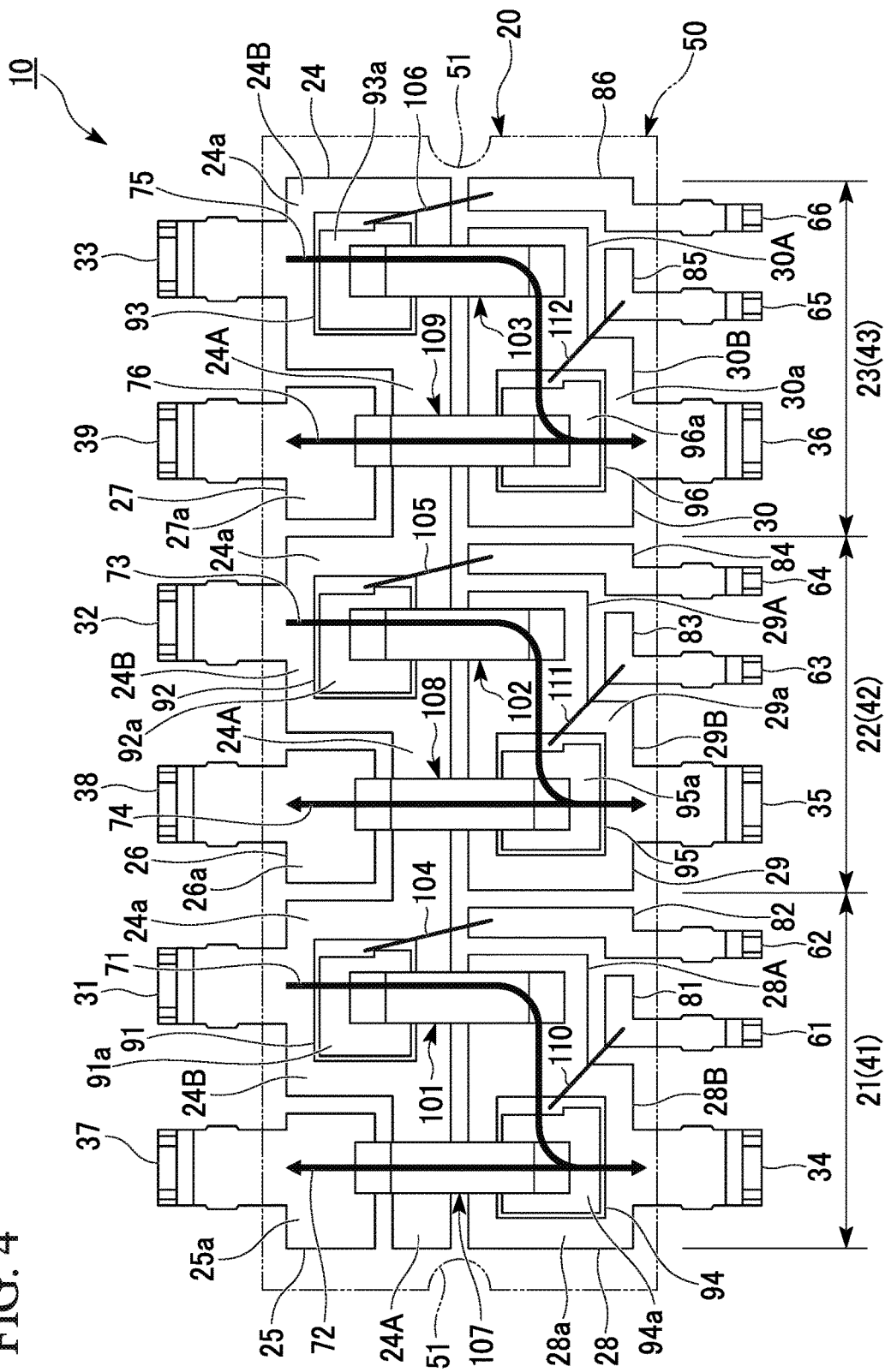
FIG. 4 is a structural plan view showing another example of a semiconductor device according to the present embodiment.

Although the case where bonding wires are used as the connectors 101, 102, 103, 107, 108, 109 has been illustrated in the present embodiment as shown in FIG. 1, the present embodiment is not limited thereto. In the present embodiment, as shown in FIG. 4, the connectors 101, 102, 103, 107, 108, 109 may be conductive board materials.

Figure 5:
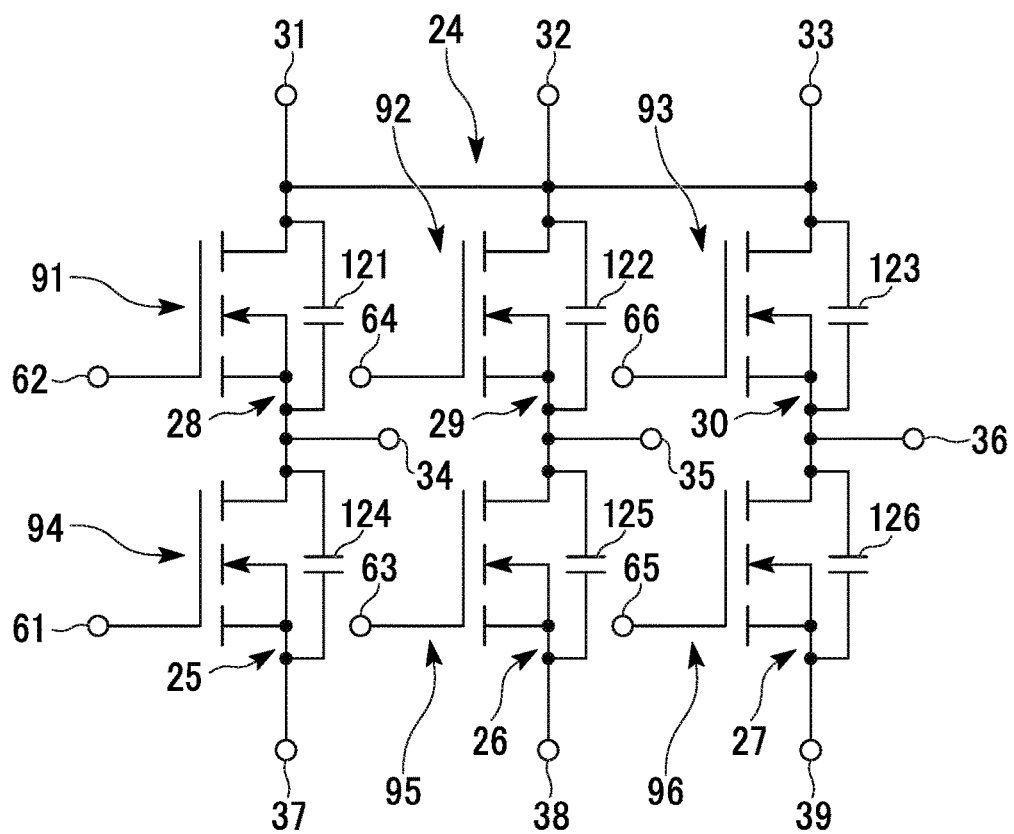
FIG. 5 is another example of a circuit diagram of the semiconductor device according to the present embodiment.

As shown in FIG. 5, the semiconductor device 10 of the present embodiment may be configured such that the power supply wiring board 24 and the output wiring boards 28, 29, 30 are connected by capacitors 121, 122, 123, and the output wiring boards 28, 29, 30 and the ground wiring boards 25, 26, 27 are connected by capacitors 124, 125, 126. In other words, the circuit units 41, 42, 43 of the present embodiment may include the capacitors 121 to 126.

In FIG. 5, the capacitors 121 to 123 are connected in parallel with the semiconductor elements 91 to 93, between the power supply wiring board 24 and the output wiring boards 28 to 30. Additionally, the capacitors 124 to 126 are connected in parallel with the semiconductor elements 94 to 96, between the output wiring boards 28, 29, 30 and the ground wiring boards 25, 26, 27.

According to the semiconductor device 10 of the present embodiment, the semiconductor device 10 includes: the power supply wiring board 24, the ground wiring boards 25, 26, 27, and the output wiring boards 28, 29, 30, which are disposed separately from one another; the semiconductor elements 91 to 96 disposed on first main surfaces of the wiring boards and electrically connected to the wiring boards; the power supply terminals 31, 32, 33, the output terminals 34, 35, 36, and the ground terminals 37, 38, 39, which are electrically connected to these wiring boards; and a sealing resin 50 sealing the wiring boards, the semiconductor elements, and the terminals so that the second main surfaces of the wiring boards are exposed. For this reason, heat generated in the semiconductor elements 91 to 96 can be efficiently transmitted from the first main surfaces to the second main surfaces through the wiring boards with high thermal conductivity. Therefore, the heat of the semiconductor elements 91 to 96 can be efficiently released to the outside.

According to the semiconductor device 10 of the present embodiment, the three power supply terminals 31, 32, 33 and the power supply wiring board 24 are integrally formed. Additionally, the output terminals 34, 35, 36 and the output wiring boards 28, 29, 30 are integrally formed. Further, the ground terminals 37, 38, 39 and the ground wiring boards 25, 26, 27 are integrally formed. For this reason, it is possible to downsize the semiconductor device 10 while suppressing electrical loss in the semiconductor device 10.

According to the semiconductor device 10 of the present embodiment, the wiring boards includes the power supply wiring board 24, the ground wiring boards 25, 26, 27, and the output wiring boards 28, 29, 30. The power supply wiring board 24 includes the narrow portions 24A and the wide portions 24B continuously extending in a direction orthogonal to the linear direction. The semiconductor elements 91, 92, 93 are disposed respectively on the three wide portions 24B of the power supply wiring board 24. For this reason, heat generated in the semiconductor elements 91, 92, 93 can be efficiently released to the narrow portions 24A of the power supply wiring board 24. This makes it possible to prevent the heat generated in the semiconductor elements 91, 92, 93 from being biased to a part of the semiconductor device 10.

According to the semiconductor device 10 of the present embodiment, the power supply wiring board 24 has plural pairs of narrow portions 24A and wide portions 24B. For this reason, the heat generated in the three semiconductor elements 91, 92, 93 disposed respectively on the narrow portions 24A of the power supply wiring board 24 can be uniformly dissipated throughout the power supply wiring board 24. In other words, it is possible to improve the heat dissipation efficiency.

According to the semiconductor device 10 of the present embodiment, the semiconductor elements 91, 92, 93 disposed on the first main surfaces 24a of the wide portions 24B of the power supply wiring board 24 and the narrow portions 28A, 29A, 30A of the output wiring boards 28, 29, 30 are connected respectively by the connectors 101, 102, 103. For this reason, the heat generated in the semiconductor elements 91, 92, 93 can be efficiently transferred to the narrow portions 28A, 29A, 30A of the output wiring boards 28, 29, 30 through the connectors 101, 102, 103. Therefore, the heat dissipation efficiency of the semiconductor device 10 can be improved.

According to the semiconductor device 10 of the present embodiment, the output wiring boards 28, 29, 30 have the narrow portions 28A, 29A, 30A and the wide portions 28B, 29B, 30B continuously extending in the direction orthogonal to the linear direction. Additionally, the semiconductor elements 94, 95, 96 are disposed respectively on the three wide portions 28B, 29B, 30B of the output wiring boards 28, 29, 30. Further, the three narrow portions 24A of the power supply wiring board 24 are disposed so as to respectively face the wide portions 28B, 29B, 30B of the output wiring boards 28, 29, 30. Moreover, the three wide portions 24 B of the power supply wiring board 24 are disposed so as to face the narrow portions 28A, 29A, 30A of the output wiring boards 28, 29, 30. This makes it possible to suppress a bias of the heat distribution on the heat radiation surface of the semiconductor device 10 (the second main surfaces of the plurality of wiring boards (e.g., the second main surface 24b of the power supply wiring board 24, the second main surface 25b of the first ground wiring board 25, the second main surface 28b of the first output wiring board 28), and the lower surface 50a of the sealing resin 50).

According to the semiconductor device 10 of the present embodiment, the semiconductor elements 91, 92, 93 disposed respectively on the wide portions 24B of the power supply wiring board 24 are disposed separately in the direction orthogonal to the arrangement direction of the output terminals 34, 35, 36 and the ground terminals 37, 38, 39 to constitute the first element group. Additionally, the semiconductor elements 94, 95, 96 disposed respectively on the wide portions 28B, 29B, 30B of the output wiring boards 28, 29, 30 are disposed separately in the direction orthogonal to the arrangement direction of the output terminals 34, 35, 36 and the ground terminals 37, 38, 39 to constitute the second element group. The center of each of the semiconductor element boards 95, 96 included in the second element group is positioned between the centers of two of the semiconductor elements 91, 92, 93 included in the first element group in the direction orthogonal to the arrangement direction of the output terminal boards 34, 35, 36 and the around terminals 37, 38, 39. For this reason, the first current paths 71, 73, 75 and the second current paths 72, 74, 76 can be further simplified. Additionally, it is possible to equalize the heat distribution in the device main body 20 based on the heat generated in the plurality of semiconductor elements 91 to 96, in other words, it is possible to prevent the concentration of heat in the device main body 20 and to improve the heat dissipation efficiency of the semiconductor device 10.

According to the semiconductor device 10 of the present embodiment, the semiconductor elements 94, 95, 96 disposed on the first main surfaces 28a, 29a, 30a of the wide portions 28B, 29B, 30B of the output wiring boards 28, 29, 30, and the ground wiring boards 25, 26, 27 are connected by the connectors 107, 108, 109. For this reason, the heat generated in the semiconductor elements 94, 95, 96 can be efficiently transferred to the ground wiring boards 25, 26, 27 through the connectors 107, 108, 109. Therefore, the heat radiation efficiency of the semiconductor device 10 can be improved.

According to the semiconductor device 10 of the present embodiment, the connectors 101, 102, 103, 107, 108, 109 are conductive board materials. Since board materials are smaller in electric resistance than bonding wires, the electrical loss in the semiconductor device 10 can be reduced. Additionally, since the board materials are higher in thermal conductivity than bonding wires, it is possible to further improve the heat dissipation efficiency of the semiconductor device 10.

According to the semiconductor device 10 of the present embodiment, the wiring boards include the gate wiring boards 81, 83, 85. Additionally, the terminals include: the power supply terminals 31, 32, 33 connected to the power supply wiring board 24; the ground wiring terminals 37, 38, 39 connected to the ground wiring boards 25, 26, 27; the output terminals 34, 35, 36 connected to the output wiring boards 28, 29, 30; and the gate terminals 61 to 66 connected to the gate wiring boards 81, 83, 85. The power supply terminals 31, 32, 33, the output terminals 34, 35, 36, and the ground terminals 37, 38, 39 are larger in width than the gate terminals 61 to 66. This makes it possible to downsize the semiconductor device 10 while suppressing the electrical loss in the semiconductor device 10. Since a large current flows through the power supply terminals 31, 32, 33, the output terminals 34, 35, 36, and the ground terminals 37, 38, 39, by making these terminals wide in width, the electric resistance at these terminals can be kept small, and the electrical loss at these terminals can be suppressed. On the other hand, since only a small current flows through the gate terminals 61 to 66, even if these terminals are made narrow in width, the electrical loss at these terminals can be suppressed.

According to the semiconductor device 10 of the present embodiment, the wiring boards include the power supply wiring board 24, the ground wiring boards 25, 26, 27, the output wiring boards 28, 29, 30. Additionally, the output wiring boards 28, 29 30 have the narrow portions 28A, 29A, 30A and the wide portions 28B, 29B, 30B continuously extending in the linear direction. The semiconductor elements 94, 95, 96 are disposed respectively on the wide portions 28B, 29B, 30B of the output wiring boards 28, 29, 30. This makes it possible to uniformly dissipate the heat generated in the three semiconductor elements 91, 92, 93 disposed respectively on the wide portions 28B, 29B, 30B of the output wiring boards 28, 29, 30 throughout the power supply wiring board 24. In other words, it is possible to improve the heat dissipation efficiency.

According to the semiconductor device 10 of the present embodiment, the through holes 51, 51 penetrating in the thickness direction of the power supply wiring board 24, the output wiring boards 28, 29, 30, and the ground wiring boards 25, 26, 27 are formed in the sealing resin 50. For this reason, the semiconductor device 10 can be fixed to a heat dissipation member by screwing using the through holes 51, 51. By this fixing, the second main surfaces of the power supply wiring board 24, the output wiring boards 28, 29, 30, and the ground wiring boards 25, 26, 27 (the lower surface of the device main body 20) can be pressed against a heat dissipation member 150 illustrated in FIG. 6. This makes it possible to ensure contact between the heat dissipation member 150 and the second main surfaces of the power supply wiring board 24, the output wiring boards 28, 29, 30, and the ground wiring boards 25, 26, 27, so that the heat generated in the semiconductor elements 91 to 96 can be efficiently released from the second main surfaces of the wiring boards to the heat dissipation member 150.

Additionally, the through holes 51, 51 are formed at both ends of the sealing resin 50 in the direction orthogonal to the above-described linear direction. This makes it possible to secure surface contact between the heat dissipation member 150 and the second main surfaces of the power source wiring board 24, the output wiring boards 28, 29, 30, and the ground wiring boards 25, 26, 27 (the lower surface of the device main body 20). This makes it possible to more efficiently release the heat generated in the semiconductor elements 91 to 96 from the second main surfaces of these wiring boards to the heat dissipation member 150.

Figure 6:
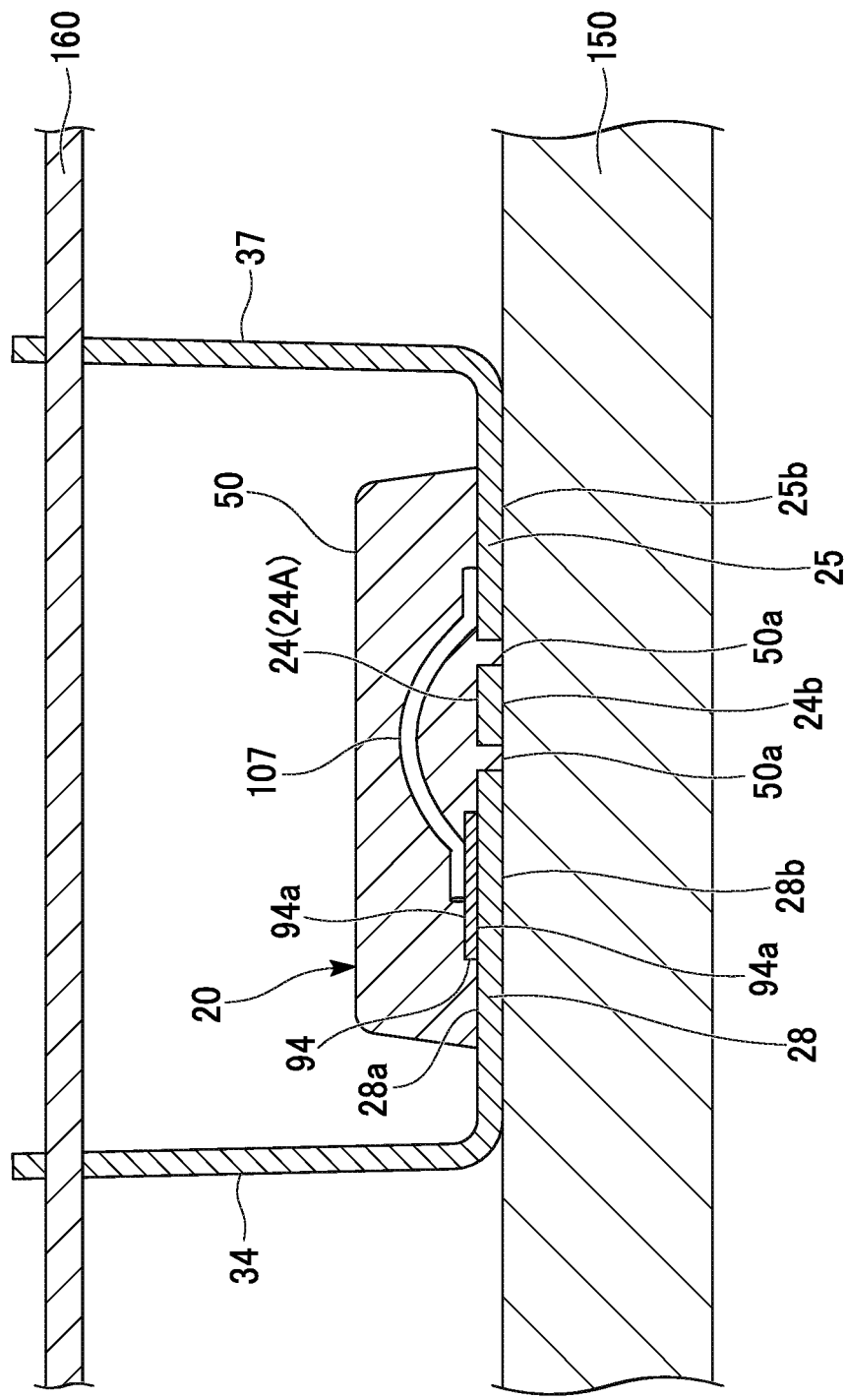
FIG. 6 is a sectional structural view showing a method of mounting a semiconductor device according to the present embodiment.

According to the semiconductor device 10 of the present embodiment, the tip end portions of the power supply terminals 31, 32, 33, the output terminals 34, 35, 36, and the ground terminals 37, 38, 39 extending from the power supply wiring board 24, the output wiring boards 28, 29, 30, and the ground wiring boards 25, 26, 27 extend in the thickness direction of these wiring boards so as to protrude from the first main surfaces of these wiring boards. For this reason, as shown in FIG. 6, the semiconductor device 10 can be connected to a circuit board 160 at a position away from the heat dissipation member 150 with which the lower surface of the semiconductor device 10 contacts.

According to the semiconductor device 10 of the present embodiment, the power supply wiring board 24 and each of the output wiring boards 28, 29, 30 are connected by the capacitors 121, 122, 123, while the output wiring boards 28, 29, 30 and the ground wiring boards 25, 26, 27 are connected by the capacitors 124, 125, 126. In a case where the semiconductor elements 91 to 96 are switching elements such as MOF-FETs and IGBTs to be mounted on on-vehicle electrical equipment, a current is intermittently flowed by switching of the semiconductor elements 91 to 96. By providing the semiconductor device 10 with the capacitors 121 to 126, voltage fluctuation at the time of switching of the semiconductor elements 91 to 96 can be reduced.

[Lead Frame]

Hereinafter, a lead frame according to an embodiment of the present invention will be described with reference to the drawings.

Figure 7:
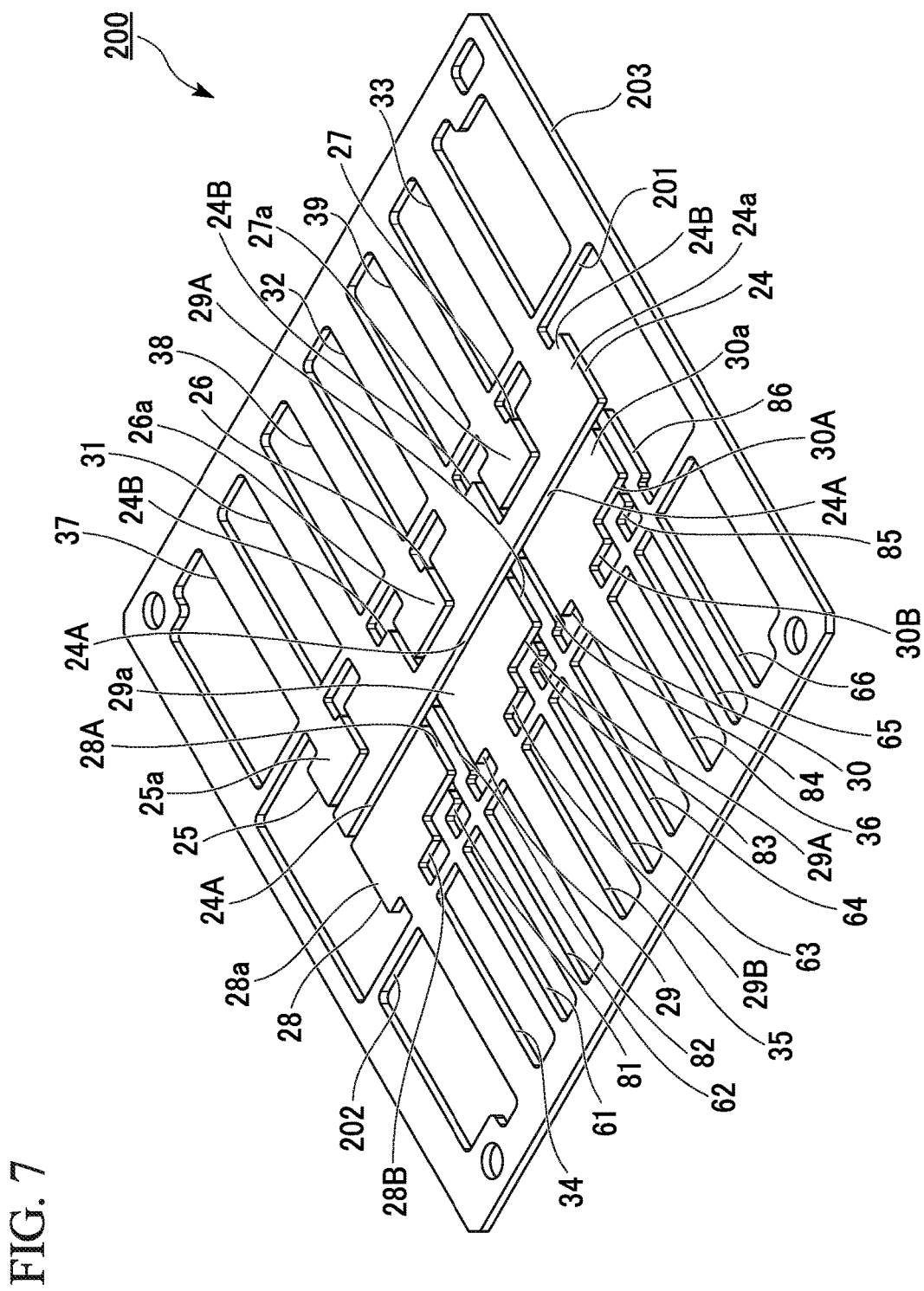
FIG. 7 is a perspective view showing an example of a lead frame according to the present embodiment.

As shown in FIG. 7, a lead frame 200 of the present embodiment is configured such that the plurality of wiring boards (the power supply wiring hoard 24, the ground wiring boards 25, 26, 27, the output wiring boards 28, 29, 30, and the gate wiring boards 81 to 86), the plurality of terminals (the power supply terminals (leads) 31, 32, 33, the output terminals (leads) 34, 35, 36, the ground terminals (leads) 37, 38, 39, and the gate terminals 61 to 66) are integrally formed, and the plurality of terminals are connected by connecting portions (tie bars 201, 202, and a frame portion 203).

In the present embodiment, in the lead frame 200 shown in FIG. 7, the same components as those of the semiconductor device 10 shown in FIG. 1 are appended with the same reference numerals, and description of these components are omitted here.

The tie bars 201, 202 of the connecting portions are formed so as to connect, in the arrangement direction of the plurality of terminals, the portions of the terminals adjacent to the wiring boards.

The frame portion 203 of the connecting portions is formed so as to connect portions of the terminals on the side opposite to the wiring boards, and portions of the tie bars 201, 202 to be separated from the terminals, and so as to surround the wiring boards and the terminals.

The lead frame 200 of the present embodiment is used as a lead frame for the semiconductor device 10.

In other words, the lead frame 200 of the present embodiment is used as the plurality of wiring boards (the power supply wiring board 24, the ground wiring boards 25, 26, 27, the output wiring boards 28, 29, 30, and the gate wiring boards 81 to 86) and the plurality of terminals (the power supply terminals (leads) 31, 32, 33, the output terminals (leads) 34, 35, 36, the ground terminals (leads) 37, 38, 39, and the gate terminals 61 to 66), which constitutes the semiconductor device 10.

According to the lead frame 200 of the present embodiment, the plurality of terminal boards and the plurality of terminals are integrally formed, and the plurality of terminals are connected by the tie bars 201, 202 and the frame portion 203. For this reason, the semiconductor elements 91 to 96 can be mounted separately on the first main surfaces 24a of the three wide portions 24B of the power supply wiring board 24, and the first main surfaces 28a, 29a, 30a of the three wide portions 28B, 29B, 30B of the output wiring boards 28, 29, 30. This makes it possible to obtain the semiconductor device 10 in which the heat generated in the semiconductor elements 91 to 96 is not biased to a part thereof.

[Method of Manufacturing Semiconductor Device]

Next, an example of a method of manufacturing the semiconductor device 10 using the lead frame 200 will be described.

In manufacturing the semiconductor device 10, firstly, the lead frame 200 having the above-described structure is prepared (frame preparation step).

Figure 8:
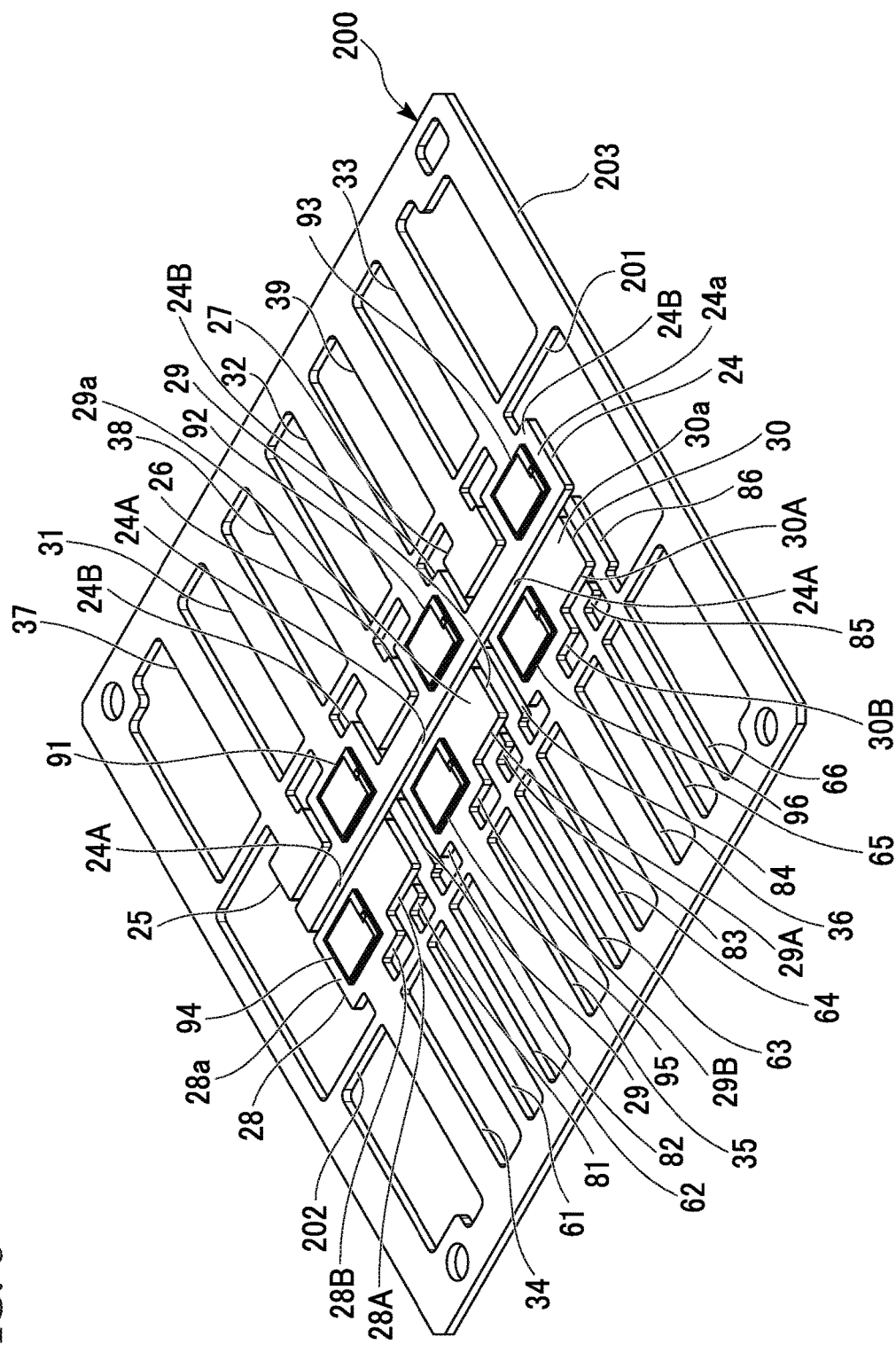
FIG. 8 is a perspective view showing an example of a mounting step in a method of manufacturing a semiconductor device according to the present embodiment.

Next, as shown in FIG. 8, the plate-like semiconductor elements 91, 92, 93 are mounted respectively on the first main surfaces 24a of the three wide portions 24B of the power supply wiring board 24, and the plate-like semiconductor elements 94, 95, 96 are fixed respectively onto the first main surfaces 28a, 29a, 30a of the three wide portions 28B, 29B, 30B of the output wiring boards 28, 29, 30 (mounting step).

Here, the semiconductor elements 91 to 96 have electrodes on the upper surfaces 91a to 96a (see FIG. 1) and the lower surfaces (the surfaces on the opposite side to the upper surfaces 91a to 96a). Additionally, the semiconductor elements 91 to 96 are elements that generate heat by energisation, such as switching elements.

In the mounting process, the lower surfaces of the semiconductor elements 91 to 96 are electrically bonded, through a conductive adhesive with conductivity such as solder, respectively to the first main surfaces 24a of the three wide portions 24B of the power supply wiring board 24 and the first main surfaces 28a, 29a, 30a of the three wide portions 28B, 29B, 30B of the output wiring board 28, 29, 30. Thereby, the semiconductor elements 91 to 96 are fixed and electrically connected to the power supply wiring board 24 and the output wiring boards 28, 29, 30.

Figure 9:
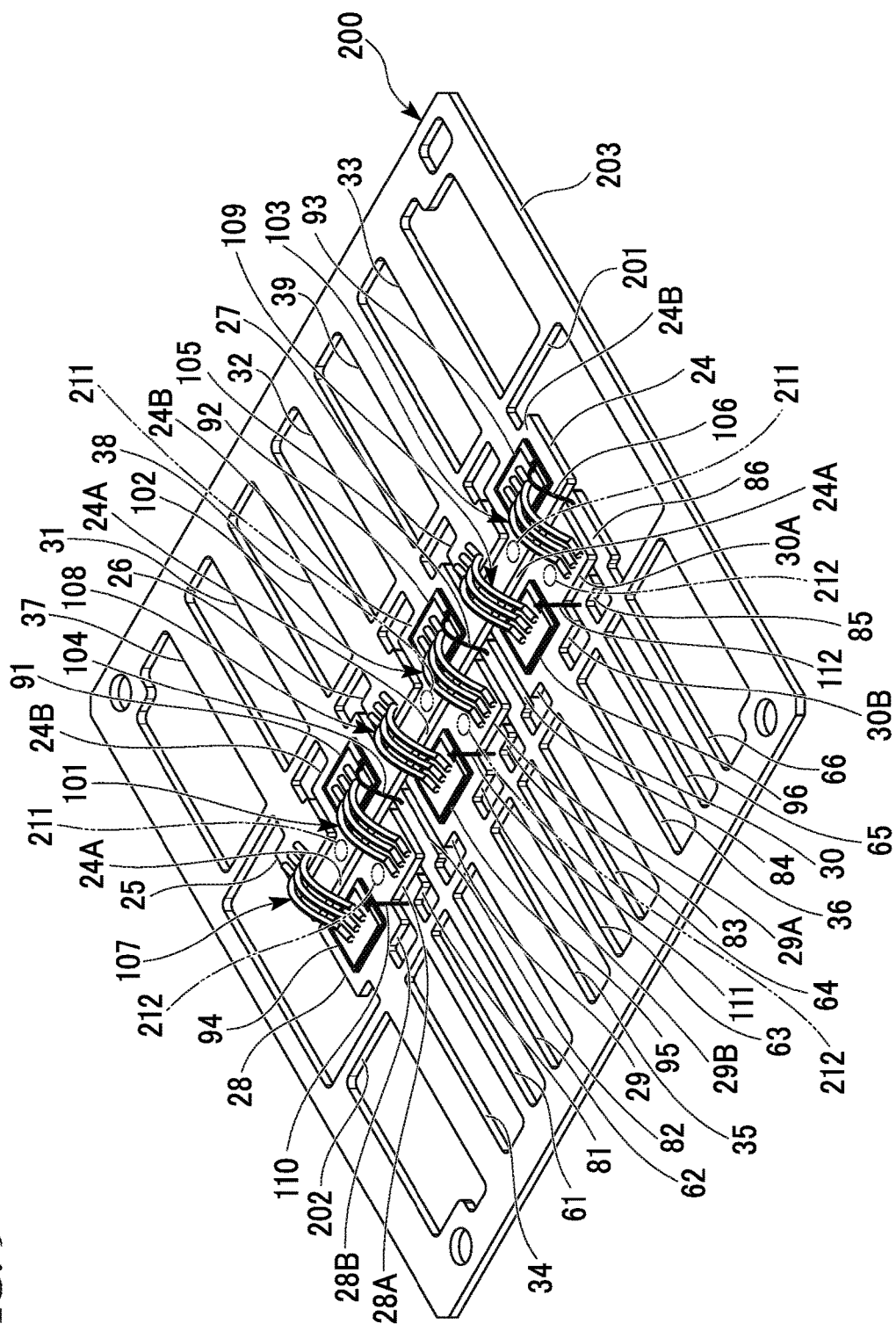
FIG. 9 is a perspective view showing an example of a connecting step in the method of manufacturing the semiconductor device according to the present embodiment.
Figure 10:
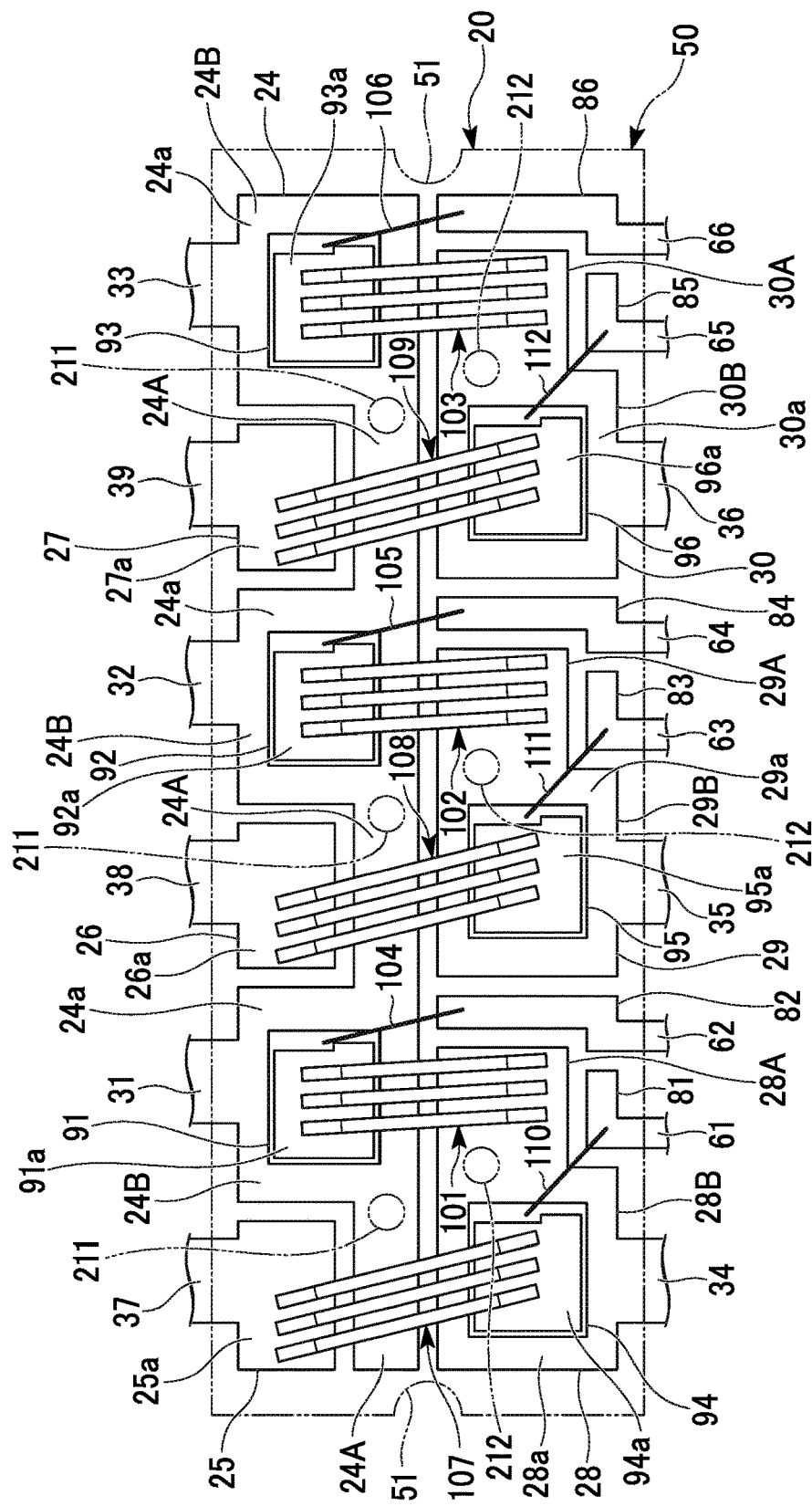
FIG. 10 is a plan view showing an example of the connecting step and a sealing step in the method of manufacturing the semiconductor device according to the present embodiment.

Next, as shown in FIGS. 9 and 10, both ends of the connectors 101, 102, 103 are bonded to the upper surfaces 91a, 92a, 93a of the semiconductor elements 91, 92, 93 and the first main surfaces (upper surfaces) 28a, 29a, 30a of the narrow portions 28A, 29A, 30A of the output wiring boards 28, 29, 30 (connecting step). Thereby, the semiconductor elements 91, 92, 93 and the output wiring boards 28, 29, 30 are electrically connected.

As shown in FIGS. 9 and 10, both ends of the connectors 104, 105, 106 are bonded to the upper surfaces 91a, 92a, 93a of the semiconductor elements 91, 92, 93 and the upper surfaces of the gate wiring boards 82, 84, 86 (connecting step). Thereby, the semiconductor elements 91, 92, 93 and the gate wiring boards 82, 84, 86 are electrically connected.

Additionally, as shown in FIGS. 9 and 10, both ends of the connectors 107, 108, 109 are bonded to the upper surfaces 94a, 95a, 96a of the semiconductor elements 94, 95, 96 and the first main surfaces (upper surfaces) 25a, 26a, 27a of the ground wiring boards 25, 26, 27 (connecting step). Thereby, the semiconductor elements 94, 95, 96 and the ground wiring boards 25, 26, 27 are electrically connected.

Further, as shown in FIGS. 9 and 10, both ends of the connectors 110, 111, 112 are bonded to the upper surfaces 94a, 95a, 96a of the semiconductor elements 94, 95, 96 and the upper surfaces of the gate wiring boards 81, 83, 85 (connecting step). Thereby, the semiconductor elements 94, 95, 96 and the gate wiring boards 81, 83, 85 are electrically connected.

Figure 11:
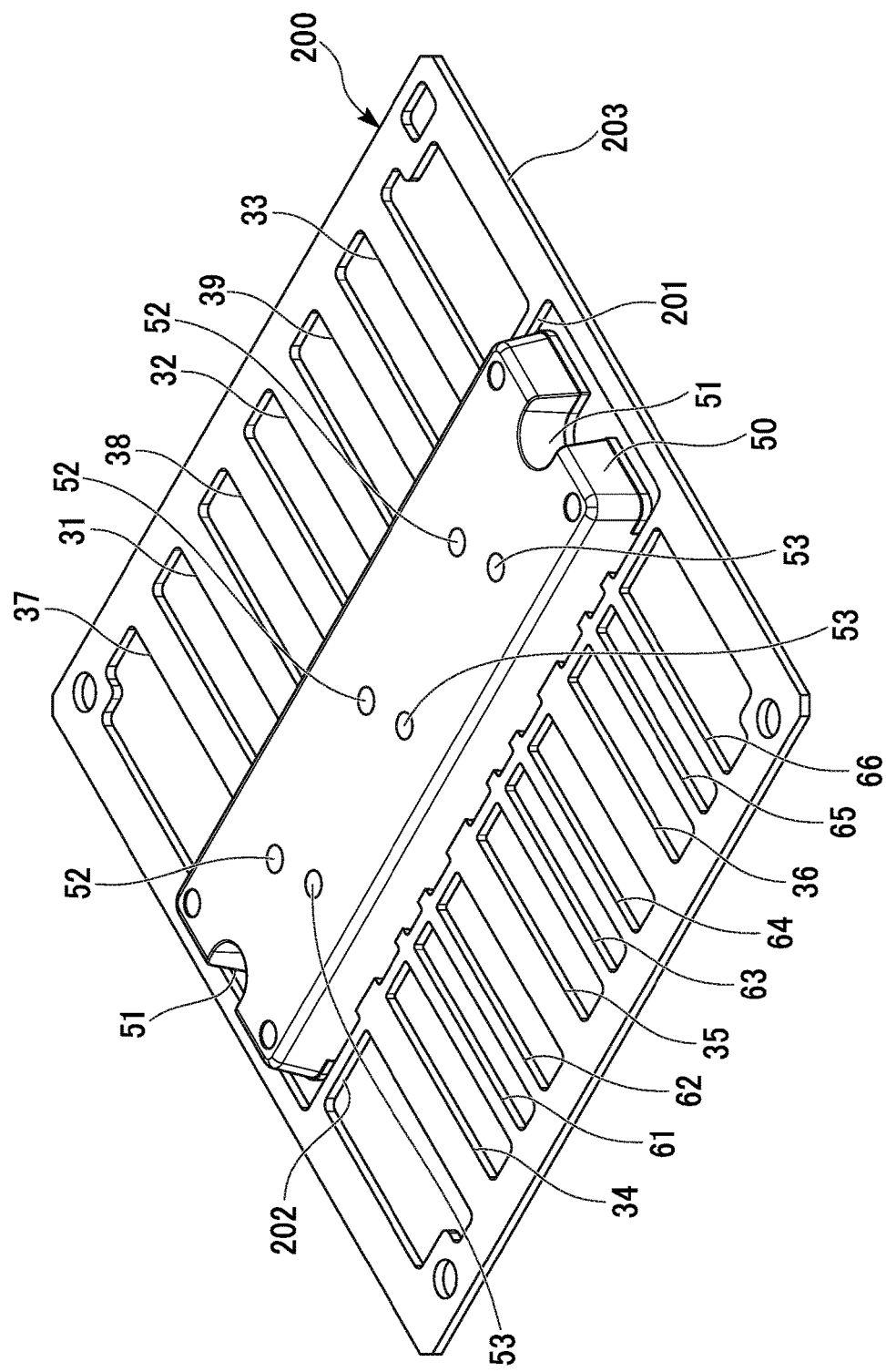
FIG. 11 is a perspective view showing an example of the sealing step in the method of manufacturing the semiconductor device according to the present embodiment.

Next, as shown in FIGS. 9 to 11, the power supply wiring board 24, the ground wiring boards 25, 26, 27, the output wiring boards 28, 29, 30, the gate wiring boards 81 to 86, the semiconductor elements 91 to 96, and the connectors 101 to 112 are sealed with the sealing resin 50 so that the second main surfaces of the power supply wiring board 24, the ground wiring boards 25, 26, 27, and the output wiring boards 28, 29, 30 are exposed (see FIG. 2) (sealing step).

In the sealing step, for example, an insert molding may be used in which the power supply wiring board 24, the ground wiring boards 25, 26, 27, the output wiring boards 28, 29, 30, the gate wiring boards 81 to 86, the semiconductor elements 91 to 96, and the connectors 101 to 112 are placed in a mold, and then a resin is injected into the mold to form the sealing resin 50 in a predetermined shape. Additionally, for example, a potting may be used in which the power supply wiring board 24, the ground wiring boards 25, 26, 27, the output wiring boards 28, 29, 30, the gate wiring boards 81 to 86, the semiconductor elements 91 to 96, and the connectors 101 to 112 are placed in a mold form, and then a resin is dropped so as to cover these elements to form the sealing resin 50 in a predetermined shape.

Figure 12:
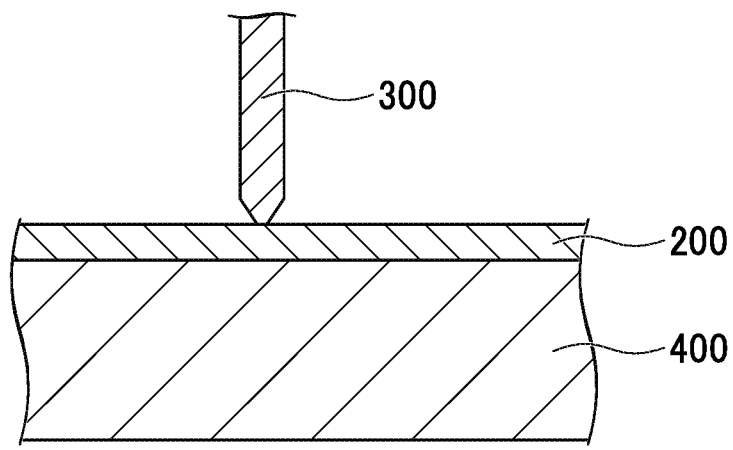
FIG. 12 is a cross-sectional view showing an example of the sealing step in the method of manufacturing the semiconductor device according to the present embodiment.

It is preferable that in the sealing step, as shown in FIGS. 10 and 12, support pins 300 are pressed against the first main surfaces of the plurality of wiring boards forming the lead frame 200 (the power supply wiring board 24, the ground wiring boards 25, 26, 27, the output wiring boards 28, 29, 30, and the gate wiring boards 81 to 86). Thereby, the second main surfaces of the plurality of wiring boards constituting the lead frame 200 are pressed against a mold (or form) 400 for forming the sealing resin 50.

It is preferable that in the sealing step, as shown in FIG. 12, the support pins 300 are pressed against boundary portions between the narrow portions 24A and the wide portions 24B (pressed positions 211 shown in FIG. 10) of the power wiring board 24 constituting the lead frame 200, and boundary portions between the narrow portions 28A, 29A, 30A and the wide portions 28B, 29B, 30B of the output wiring boards 28, 29, 30 (pressing positions 212 shown in FIG. 10).

In the state after the sealing step, the sealing resin 50 fills portions among the plurality of wiring boards (the power supply wiring board 24, the ground wiring boards 25, 26, 27, the output wiring boards 28, 29, 30, and the gate wiring boards 81 to 86) and portions among the plurality of terminals. Additionally, the sealing resin 50 fills portions among the power supply wiring board 24, the ground wiring boards 25, 26, 27, and the tie bar 201. The sealing resin 50 fills portions between the output wiring boards 28, 29, 30 and the tie bar 202. In other words, among the above-described plurality of terminals, the portions on the side of the plurality of wiring hoards with respect to the tie bars 201, 202 are sealed with the sealing resin 50.

Further, in the case of using the above-described support pins 300 in the sealing step, in a state after the sealing step, for example, as shown in FIG. 11, pin holes 52, 53 resulting from the above-described support pins 300 are formed in the sealing resin 50.

Among the tie bars 201, 202, the frame portion 203, and the plurality of terminals, portions outside the tie bars 201, 202 are positioned outside the sealing resin 50. Additionally, the second main surfaces of the power supply wiring board 24, the ground wiring boards 25, 26, 27, and the output wiring boards 28, 29, 30 are exposed to the outside without being sealed by the sealing resin 50.

Figure 13:
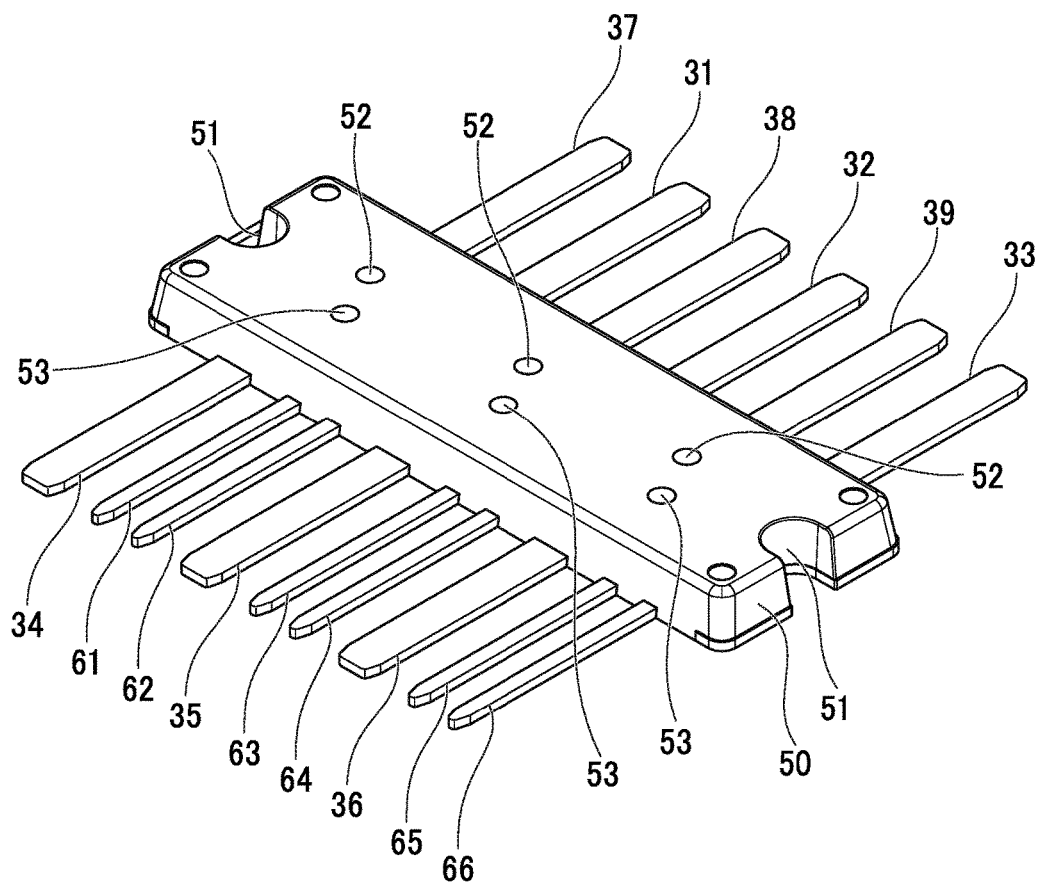
FIG. 13 is a perspective view showing an example of a cutting step in the method of manufacturing the semiconductor device according to the present embodiment.

Next, as shown in FIG. 13, the tie bars 201, 202 and the frame portion 203 are cut off from the power supply terminals 31, 32, 33, the output terminals 34, 35, 36, the ground terminals 37, 38, 39, and the gate terminals 61 to 66 (cutting step).

By performing this cutting step, the power supply terminals 31, 32, 33, the output terminals 34, 35, 36, the ground terminals 37, 38, 39, and the gate terminals 61 to 66 are electrically separated from one another.

Figure 14:
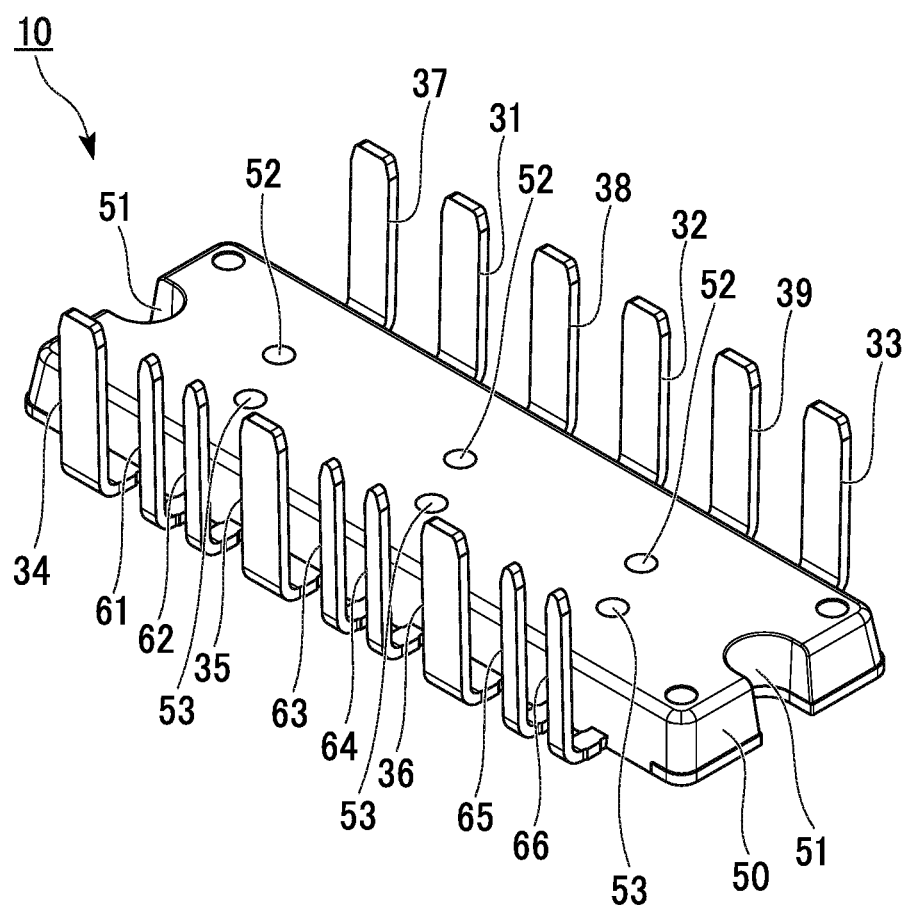
FIG. 14 is a perspective view showing an example of a folding step in the method of manufacturing the semiconductor device according to the present embodiment.

Finally, as shown in FIG. 14, the power terminals 31, 32, 33, the output terminals 34, 35, 36, the ground terminals 37, 38, 39, and the gate terminals 61 to 66 are folded (folding step), thereby completing the manufacturing of the device 10. In a state after the folding step, the tip end portions of the power supply terminals 31, 32, 33, the output terminals 34, 35, 36, the ground terminals 37, 38, 39, and the gate terminals 61 to 66 extend perpendicular from the main surface 24a of the first power supply wiring board 24, the first main surfaces 25a, 26a, 27a of the ground wiring boards 25, 26, 27, and the first main surfaces 28a, 29a, 30a of the output wiring boards 28, 29, 30.

According to the method of manufacturing the semiconductor device of the present embodiment, the method includes the sealing step of sealing the lead frame 200 and the semiconductor elements 91 to 96 with a resin so that the second main surfaces of the wiring boards constituting the lead frame 200 are exposed. This makes it possible to manufacture the semiconductor device 10 capable of transferring heat generated in the semiconductor elements 91 to 96 from the first main surfaces to the second main surfaces through the wiring boards with high thermal conductivity, so that the heat generated by the semiconductor elements 91 to 96 can be efficiently released to the outside.

According to the method of manufacturing the semiconductor device of the present embodiment, in the sealing step, the support pins 300 are pressed against the first main surfaces of the wiring boards. This makes it possible to, in the sealing step, prevent the second main surfaces of the plurality of wiring boards constituting the lead frame 200 (the power supply wiring board 24, the ground wiring boards 25, 26, 27, the output wiring boards 28, 29, 30, and the gate wiring boards 81 to 86) from being covered with the resin. In other words, it is possible to expose the second main surfaces of the plurality of wiring boards.

According to the method of manufacturing the semiconductor device of the present embodiment, in the sealing step, the support pins 300 are pressed against the boundary portions between the narrow portions 24A and the wide portions 24B of the power supply wiring board 24 constituting the lead frame 200 (the pressed positions 211 shown in FIG. 10), and the boundary portions between the narrow portions 28A, 29A, 30A and the wide portions 28B, 29B, 30B of the output wiring boards 28, 29, 30 (the pressed positions 212 shown in FIG. 10). Thereby, the plurality of wiring boards constituting the lead frame 200 can be temporarily and stably fixed by the mold (or form 400 for forming the sealing resin 50.

DESCRIPTION OF REFERENCE NUMERALS 10 semiconductor device
20 device main body
21, 22, 23 device unit
24 power wiring board
25, 26, 27 ground wiring board
28, 29, 30 output wiring board
31, 32, 33 power supply terminal
34, 35, 36 output terminal
37, 38, 39 ground terminal
41, 42, 43 circuit unit
50 sealing resin
51 through hole
52, 53 pin hole
61, 62, 63, 64, 65, 66 gate terminal
71, 73, 75 first current path
72, 74, 76 second current path
81, 82, 83, 84, 85, 86 gate wiring board
91, 92, 93, 94, 95, 96 semiconductor element
101, 102, 103, 104, 105, 106, 107, 108, 109, 110, 111, 112 connector
121, 122, 123, 124, 125, 126 capacitor
150 heat dissipation member
160 circuit board
200 lead frame
201, 202 tie bar
203 frame portion
211, 212 pressing position

The invention claimed is:

1. A semiconductor device comprising:
a plurality of wiring boards disposed separately from one another;
a plurality of semiconductor elements disposed on first main surfaces of the plurality of wiring boards and electrically connected to the plurality of wiring boards;
a plurality of terminals electrically connected to the plurality of wiring boards; and
a resin sealing the plurality of wiring boards and the plurality of semiconductor elements so that second main surfaces of the plurality of wiring boards are exposed, wherein
the plurality of wiring boards include a power supply wiring board, a first ground wiring board, and a first output wiring board,
the power supply wiring board has a narrow portion and a wide portion continuously extending in a linear direction,
the first output wiring board has a narrow portion and a wide portion continuously extending in the linear direction,
a first semiconductor element of the plurality of semiconductor elements is disposed on the wide portion of the power supply wiring board, and
the resin has pin holes at a boundary portion between the narrow portion and the wide portion of the power supply wiring board, and a boundary portion between the narrow portion and the wide portion of the first output wiring board.

2. The semiconductor device according to claim 1, wherein
the plurality of wiring boards and the plurality of terminals are integrally formed.

3. The semiconductor device according to claim 1, wherein the power supply wiring board has a plurality of narrow portions and a plurality of wide portions.

4. The semiconductor device according to claim 1, wherein the first semiconductor element is connected to the narrow portion of the first output wiring board by a connector.

5. The semiconductor device according to claim 1, wherein
a second semiconductor element of the plurality of semiconductor elements is disposed on the wide portion of the first output wiring board,
the narrow portion of the power supply wiring board is disposed so as to face the wide portion of the first output wiring board, and
the wide portion of the power supply wiring board is disposed so as to face the narrow portion of the first output wiring board.

6. The semiconductor device according to claim 5, wherein
the plurality of wiring boards include a second output wiring board different from the first output wiring board,
the second output wiring board having a narrow portion and a wide portion continuously extending in the linear direction,
a third semiconductor element of the plurality of semiconductor elements is disposed on the wide portion of the second output wiring board, and the second semiconductor element, the first semiconductor element, and the third semiconductor element are disposed in this order in the linear direction.

7. The semiconductor device according to claim 5, wherein
the second semiconductor element is connected to the first ground wiring board by a connector.

8. The semiconductor device according to claim 1, wherein
the plurality of wiring boards include a first gate wiring board,
the plurality of terminals include
   a first power supply terminal connected to the power supply wiring board,
   a first ground terminal connected to the first ground wiring board,
   a first output terminal connected to the first output wiring board, and
   a first gate terminal connected to the first gate wiring board, and
the first power supply terminal, the first output terminal, and the first ground terminal are larger in width than the first gate terminal.

9. The semiconductor device according to claim 1, wherein
a second semiconductor element of the plurality of semiconductor elements is disposed on the wide portion of the first output wiring board.

10. The semiconductor device according to claim 1, wherein
the resin has through holes.

11. The semiconductor device according to claim 10, wherein
the resin has the through holes at both ends, in the linear direction, of the resin.

12. The semiconductor device according to claim 1, wherein
tip end portions of the plurality of terminals extend from the plurality of wiring boards in a thickness direction of the plurality of wiring boards so as to protrude from the first main surfaces of the plurality of wiring boards.

13. The semiconductor device according to claim 1, wherein
adjacent ones of the plurality of wiring boards are connected by a capacitor.

14. The semiconductor device according to claim 6, wherein
the second semiconductor element, the first semiconductor element, and the third semiconductor element are disposed zigzag in this order in the linear direction.

* * * * *